United States Patent
Yamada

(10) Patent No.: US 7,268,544 B2
(45) Date of Patent: Sep. 11, 2007

(54) MAGNETISM DETECTING DEVICE FOR CANCELING OFFSET VOLTAGE

(75) Inventor: Yukimitsu Yamada, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 81 days.

(21) Appl. No.: 11/230,815

(22) Filed: Sep. 19, 2005

(65) Prior Publication Data
US 2006/0071660 A1    Apr. 6, 2006

(30) Foreign Application Priority Data
Oct. 1, 2004 (JP) ............... 2004-289851

(51) Int. Cl.
*G01R 33/02* (2006.01)

(52) U.S. Cl. ............ 324/252; 324/244; 324/247; 33/356

(58) Field of Classification Search ........ 324/244–260; 33/356, 361
See application file for complete search history.

(56) References Cited

U.S. PATENT DOCUMENTS

| | | | |
|---|---|---|---|
| 5,046,260 A | | 9/1991 | Wellhausen |
| 5,435,070 A | * | 7/1995 | Kilian ............. 33/361 |
| 5,564,194 A | * | 10/1996 | Fujita et al. ......... 33/355 R |
| 6,523,271 B2 | | 2/2003 | Kato |

FOREIGN PATENT DOCUMENTS

| | | |
|---|---|---|
| JP | 63-240393 | 10/1988 |
| JP | 05-223573 | 8/1993 |
| JP | 2001-159646 | 6/2001 |
| JP | 2002-181908 | 6/2002 |
| JP | 3318761 | 6/2002 |
| JP | 2003-215220 | 7/2003 |

OTHER PUBLICATIONS

European Search Report dated Jan. 16, 2006, from corresponding European Application No. 05255815.2.

* cited by examiner

*Primary Examiner*—Jay M Patidar
(74) *Attorney, Agent, or Firm*—Beyer Weaver LLP

(57) ABSTRACT

A magnetism detecting device includes a magnetometric sensor, a bias magnetic field generating unit, a voltage applying unit, a detecting unit, and an operating unit. The detecting unit calculates a first output corresponding to a difference between two voltage values each corresponding to the positive and negative bias magnetic fields, and the positive voltage; and a second output corresponding to a difference between two voltage values each corresponding to the positive and negative bias magnetic fields, and the negative voltage. The detecting unit eliminates an offset voltage included in the first output and the second output by taking difference between the first output and the second output.

6 Claims, 9 Drawing Sheets

FIG. 5

| STAGE | PROCESSING | VOLTAGE | BIAS MAGNETIC FIELD | VOLTAGE SW | | BIAS MAGNETIC FIELD SW | | | DATA SW | OPERATION EXPRESSION |
|---|---|---|---|---|---|---|---|---|---|---|
| | | | | SW1 | SW2 | SW3 | SW4 | | SW5 | |
| S1 | MEASUREMENT OF FIRST VOLTAGE VALUE (Vs1) | POSITIVE | POSITIVE | H | H | H | H | | H | |
| | MAINTENANCE OF FIRST VOLTAGE VALUE (Vs1) | POSITIVE | POSITIVE | H | H | H | H | | H | |
| S2 | MEASUREMENT OF SECOND VOLTAGE VALUE (Vs2) | POSITIVE | NEGATIVE | H | H | L | L | | L | |
| | OPERATION OF FIRST OUTPUT VOLTAGE (Vapm2) | POSITIVE | NEGATIVE | H | H | L | L | | L | Vs1-Vs2 |
| S3 | MEASUREMENT OF FIRST VOLTAGE VALUE (Vs3) | NEGATIVE | POSITIVE | L | L | H | H | | H | |
| | MAINTENANCE OF FIRST VOLTAGE VALUE (Vs3) | NEGATIVE | POSITIVE | L | L | H | H | | H | |
| S4 | MEASUREMENT OF SECOND VOLTAGE VALUE (Vs4) | NEGATIVE | NEGATIVE | L | L | L | L | | L | |
| | OPERATION OF SECOND OUTPUT VOLTAGE (Vapm4) | NEGATIVE | NEGATIVE | L | L | L | L | | L | Vs3-Vs4 |

FIG. 10

| STAGE | PROCESSING | BIAS MAGNETIC FIELD | CONNECTION | BIAS MAGNETIC FIELD SW | | CONNECTION SW | | DATA SW | OPERATION EXPRESSION |
|---|---|---|---|---|---|---|---|---|---|
| | | | | SW3 | SW4 | SW6 | SW7 | SW5 | |
| T1 | MEASUREMENT OF FIRST VOLTAGE VALUE (Vs1) | POSITIVE | STRAIGHT | H | H | H | H | H | |
| | MAINTENANCE OF FIRST VOLTAGE VALUE (Vs1) | POSITIVE | STRAIGHT | H | H | H | H | H | |
| | MEASUREMENT OF SECOND VOLTAGE VALUE (Vs2) | NEGATIVE | STRAIGHT | L | L | H | H | L | |
| T2 | OPERATION OF FIRST OUTPUT VOLTAGE (Vapm2) | NEGATIVE | STRAIGHT | L | L | H | H | L | Vs1-Vs2 |
| T3 | MEASUREMENT OF FIRST VOLTAGE VALUE (Vs3) | POSITIVE | CROSS | H | H | L | L | H | |
| | MAINTENANCE OF FIRST VOLTAGE VALUE (Vs3) | POSITIVE | CROSS | H | H | L | L | H | |
| | MEASUREMENT OF SECOND VOLTAGE VALUE (Vs4) | NEGATIVE | CROSS | L | L | L | L | L | |
| T4 | OPERATION OF SECOND OUTPUT VOLTAGE (Vapm4) | NEGATIVE | CROSS | L | L | L | L | L | Vs4-Vs3 |

MAGNETISM DETECTING DEVICE FOR CANCELING OFFSET VOLTAGE

BACKGROUND OF THE INVENTION

1. Field of the Invention

The present invention relates to a magnetism detecting device and an electronic azimuth meter using the same.

2. Description of the Related Art

When an azimuth is electronically measured, a magnetometric sensor that detects geomagnetism is used. In order to calculate an azimuth by use of a magnetism detecting device having such a magnetometric sensor, a technology has been known in which an alternating current (AC) bias magnetic field is applied to the magnetometric sensor and a voltage outputted from the magnetometric sensor is measured when the bias magnetic field of each polarity is applied thereto. Then, the voltage value is stored in a capacitor, and an azimuth is calculated by use of the difference between the voltage values of the respective polarities. Accordingly, errors due to offset characteristics and hysteresis characteristics peculiar to the magnetometric sensor can be eliminated.

However, in the above-described magnetism detecting device, a voltage difference value outputted from an amplifier in a circuit inevitably includes an offset voltage peculiar to the amplifier, which causes an azimuth error. Generally, the offset voltage is several mV, and the azimuth is deviated by 5° to 10° due to the offset voltage.

SUMMARY OF THE INVENTION

The invention has been made in view of the above-described problems, and it is an object of the invention to provide a magnetism detecting device in which an azimuth error does not occur even when an offset voltage is inevitably generated in a voltage outputted from a detection circuit, and an electronic azimuth meter using such a magnetism detecting device.

According to a first aspect of the invention, a magnetism detecting device includes a magnetometric sensor that detects magnetism, a bias magnetic field generating unit that applies a bias electric field to the magnetometric sensor while inverting its polarity, a voltage applying unit that applies a first voltage and a second voltage to the magnetometric sensor, the first voltage and the second voltage having the same value and inverted polarities, a detecting unit that detects voltage values obtained for bias magnetic fields of respective polarities, and an operating unit that calculates an azimuth using the voltage values. The detecting unit calculates a first output voltage that is the difference between the first voltage and the voltage value obtained by applying the bias magnetic field of each polarity and a second output voltage that is the difference between the second voltage and the voltage value obtained by applying the bias magnetic field of each polarity, and eliminates an offset voltage included in the first and second output voltages by the difference between the first and second output voltages.

According to this configuration, by taking the difference between the first and second output voltages calculated by inverting the polarities of the bias magnetic field and the voltage, the offset voltage occurring in a circuit can be eliminated.

According to a second aspect of the invention, a magnetism detecting device includes a magnetometric sensor that detects magnetism, a bias magnetic field generating unit that applies a bias magnetic field while inverting its polarity, a voltage applying unit that applies a voltage to the magnetometric sensor, a detecting unit that detects voltage values obtained for the bias magnetic fields of respective polarities, and an operating unit that calculates an azimuth using the voltage values. The detecting unit has a switching unit that receives first and second voltage values obtained by applying the bias magnetic fields of the respective polarities and switches between a subtraction of the second voltage value from the first voltage value and a subtraction of the first voltage value from the second voltage value, and eliminates an offset voltage by taking the difference between values before and after switching.

According to this configuration, by subtracting the first and second voltage values obtained by applying the bias magnetic fields of the respective polarities while switching and by taking the difference of the subtraction result, the offset voltage occurring in the circuit can be eliminated.

In the magnetism detecting device according to the first or second aspect of the invention, it is preferable that the magnetometric sensor have a magnetoresistive element that represents a symmetrical resistance change with respect to a magnetic field. In this case, it is preferable that the magnetoresistive element be a GIG element or an MR element.

In the magnetism detecting device according to the first or second aspect of the invention, it is preferable that the magnetometric sensor have a bridge circuit.

According to a third aspect of the invention, an electronic azimuth meter includes a plurality of magnetism detecting devices described above, and an azimuth calculating unit that calculates the azimuth by use of difference voltages obtained by the plurality of magnetism detecting devices.

According to this configuration, the azimuth calculation can be performed by use of the difference calculated from the magnetoresistance change. In this case, since the offset voltage occurring in the circuit can be eliminated in the magnetism detecting device according to the first or second aspect of the invention, the azimuth calculation can be performed with higher precision.

BRIEF DESCRIPTION OF THE DRAWINGS

FIG. 5 is a diagram showing the states of control signals of each stage in the electronic azimuth meter according to the first embodiment of the invention;

FIG. 10 is a diagram showing the states of control signals of each stage in the electronic azimuth meter according to the second embodiment of the invention;

DESCRIPTION OF THE PREFERRED EMBODIMENT

The inventors have taken notice that an offset voltage inevitably occurs in a voltage outputted from an amplifier in a magnetism detecting device and the offset voltage causes an azimuth error. Further, the inventors have found that, by use of the difference a first output voltage calculated from a voltage value obtained by applying a bias magnetic field having an inverted polarity with respect to a first voltage and a second output voltage calculated from a voltage value obtained by applying a bias magnetic field having an inverted polarity with respect to a second voltage, the offset voltage generated when the first and second output voltages are calculated can be eliminated, and have reached the invention.

That is, the gist of the invention is to eliminate the offset voltage inevitably occurring in the voltage outputted from the amplified in the magnetism detecting device by use of the difference between the first output voltage calculated from the voltage value obtained by applying the bias magnetic field having the inverted polarity with respect to the first voltage and the second output voltage calculated from the voltage value obtained by applying the bias magnetic field having the inverted polarity with respect to the second voltage.

Hereinafter, embodiments of the invention will be described in detail with reference to the accompanying drawings.

First Embodiment

Figure 1:
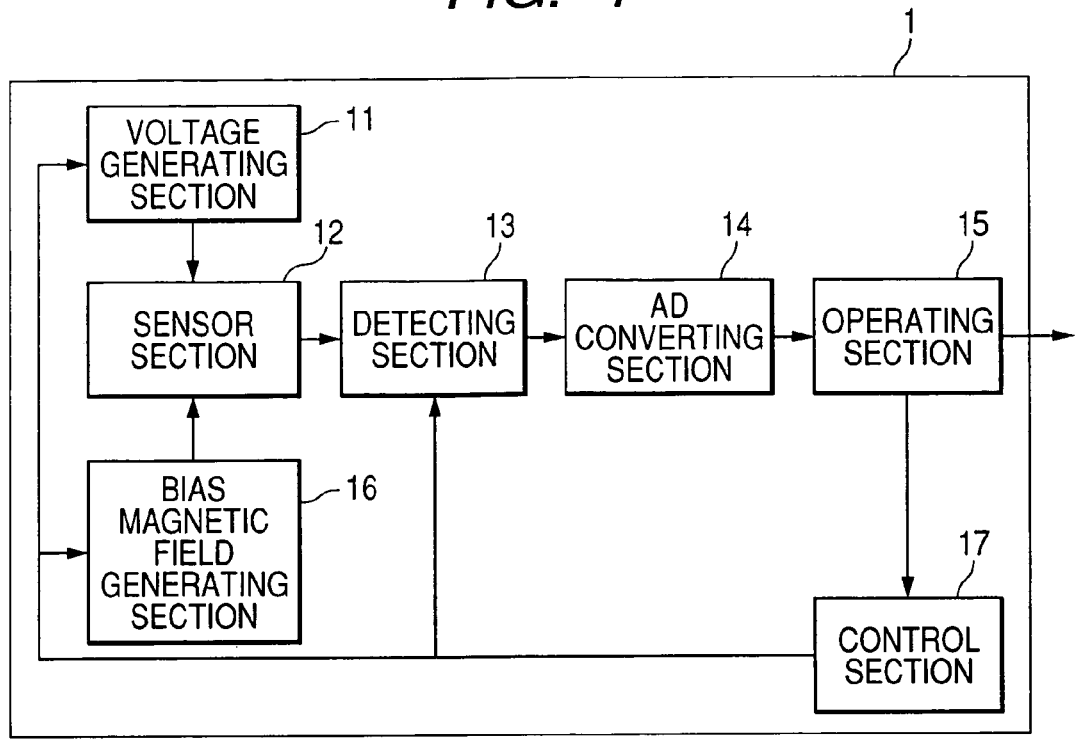
FIG. 1 is a block diagram showing a schematic configuration of an electronic azimuth meter having a magnetism detecting device according to a first embodiment of the invention.

In the present embodiment, the configuration in which a voltage is applied to a magnetometric sensor while inverting its polarity will be described. That is, in the present embodiment, a voltage of one polarity (for example, positive) is used as a first voltage and a voltage of the other polarity (for example, negative) is used as a second voltage. FIG. 1 is a block diagram showing the schematic configuration of an electronic azimuth meter having a magnetism detecting device according to a first embodiment of the invention.

The magnetism detecting device shown in FIG. 1 primarily has a sensor section 12 that output a voltage value corresponding to a change in geomagnetism, a voltage generating section 11 that alternately applies the first and second voltages (positive and negative voltages) to the sensor section 12 while switching, a bias magnetic field generating section 16 that applies a bias magnetic field to the sensor section 12, a detecting section 13 that detects (amplifies) a voltage value outputted from the sensor section 12, an AD converting section 14 that AD-converts the voltage value, an operating section 15 that calculates an azimuth by use of AD-converted digital data, and a control section 17 that controls the voltage generating section 11, the detecting section 13, and the bias magnetic field generating section 16.

The voltage generating section 11 switches the voltage to be applied to the sensor section 12. In the present embodiment, as shown in FIG. 4, the voltage generating section 11 has switches $SW_1$ and $SW_2$ that are connected to a bridge circuit of the sensor section 12. Timing of switching the voltage is controlled by the control section 17.

The sensor section 12 has a magnetometric sensor including a magnetic effect element, which has three axes of an X axis, a Y axis, and a Z axis so as to detect geomagnetism, and outputs the voltage value corresponding to the change in geomagnetism. In the present embodiment, as shown in FIG. 4, the sensor section 12 has the bridge circuit. As the magnetic effect element, a magnetoresistive element that represents a symmetrical resistance change with respect to a magnetic field is used. As such a magnetic effect element, a GIG (Granular In Gap) element, an MR (MagnetoResistance) element, or the like can be exemplified. In the present embodiment, the GIG element that can detect geomagnetism with favorable sensitivity is used.

The bias magnetic field generating section 16 supplies a current for generating the bias magnetic field to the sensor section 12 while inverting its polarity so as to switch the bias magnetic field to be applied to the sensor section 12. In the present embodiment, as shown in FIG. 4, the bias magnetic field generating section 16 has switches $SW_3$ and $SW_4$ that are connected to the bridge circuit of the sensor section 12. Timing of switching the bias magnetic field is controlled by the control section 17.

The detecting section 13 detects (amplifies) the voltage value outputted from the sensor section 12. In the present embodiment, as shown in FIG. 4, the detecting section 13 has an amplifier 131, an amplifier 132 that amplifies the voltage value, a capacitor 133 that accumulates the voltage value, and a switch $SW_5$ for switching whether or not to accumulate in the capacitor 133. Timing of accumulating the voltage value is controlled by the control section 17.

The AD converting section 14 AD-converts the analog voltage value detected by the detecting section 13 and outputs corresponding digital data to the operating section 15. Here, the resolution of the AD converting section 14 is used to correspond to ten bits.

Figure 2:
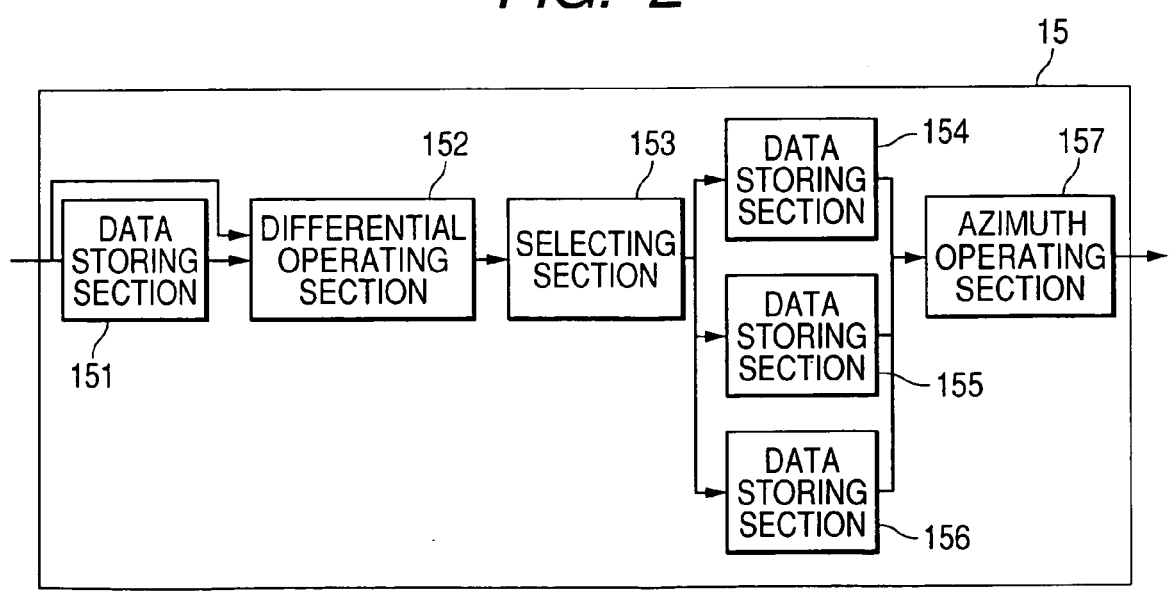
FIG. 2 is a block diagram showing an internal configuration of an operating section of the electronic azimuth meter shown in FIG. 1.

The operating section 15 performs a data operation for digital data from the AD converting section 14 and calculates the azimuth by use of the operation result. The operating section 15 has the configuration shown in FIG. 2. FIG. 2 is a block diagram showing the internal configuration of the operating section of the electronic azimuth meter shown in FIG. 1.

The operating section 15 primarily has a data storing section 151 that stores the first output voltage obtained by use of the first voltage, a differential operating section 152 that calculates the difference between the second output voltage obtained by use of the second voltage and the first output voltage stored in the data storing section 151, a selecting section 153 that selects a storage location according to a differential voltage of which axis matches with the obtained differential voltage, data storing sections 154, 155, and 156 that store differential voltages of an X axis, a Y axis, and a Z axis, and an azimuth calculating section 157 that calculates an azimuth from the differential voltages (operation result).

In the operating section 15, the first output voltage calculated from the voltage value obtained by applying the bias magnetic field of each polarity with respect to the firs voltage (positive voltage) is stored in the data storing section 151, and the second output voltage calculated from the voltage value obtained by applying the bias magnetic field of each polarity with respect to the second voltage (negative voltage) is obtained. At this time, in the differential operating section 152, the difference between the first output voltage and the second output voltage is calculated. This difference is stored in the data storing sections 154 to 156 via the selecting section 153. That is, if the difference is the difference for the X axis, it is stored in the data storing section for the X axis. If the difference is the difference for the Y axis, it is stored in the data storing section for the Y axis. Further, if the difference is the difference for the Z axis, it is stored in the data storing section for the Z axis. Then, the azimuth calculating section 157 calculates the azimuth by use of the differential voltages.

Moreover, the operating section 15 also has a function of performing a filtering process, such as an averaging process, a median process, or the like, in order to enhance security or reliability of data, or a function of correcting a drift caused by a measurement circumstance, a temperature characteristic of a sensor, or the like (calibration function).

The control section 17 supplies control signals $\phi 1$ to $\phi 4$ to the voltage generating section 11, the detecting section 13, and the bias magnetic field generating section 16 so as to control these processing sections. Further, the control section 17 has a control function of data communication with the outside of the electronic azimuth meter or the like. In this case, in order to reduce power consumption of the entire device, the respective processing sections are ON/OFF controlled.

Next, the operation of the electronic azimuth meter of the invention will be described with reference to a circuit diagram shown in FIG. 4. FIG. 4 is a circuit diagram showing an electronic azimuth meter according to the first embodiment of the invention. Moreover, in FIG. 4, for simplicity of explanation, the control section is not shown, and only the inputs of the control signals are shown. Here, it is assumed that the first voltage is positive and the second voltage is negative.

Figure 3:
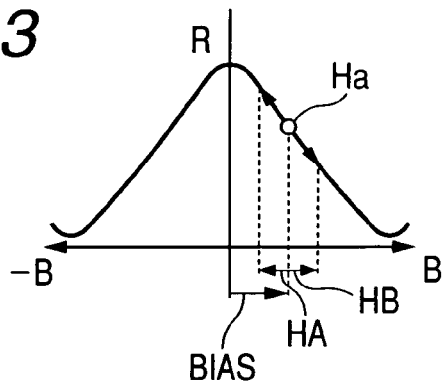
FIG. 3 is a diagram illustrating a resistance change of a magnetoresistive element.

First, the magnetoresistive element used in the sensor section 12 represents a symmetrical magnetoresistance effect with respect to a magnetic field, as shown in FIG. 3. That is, when the magnetic field does not exist at all, resistance of the magnetoresistive element is the maximum, and, when any one of positive and negative bias magnetic fields is applied, the resistance becomes small. If the positive bias magnetic field is applied to the magnetoresistive element, as shown in FIG. 3, the resistance is changed by the bias magnetic field while centering on Ha. Then, at this time, if an additional magnetic field from the outside, such as geomagnetism, is applied to the magnetoresistive element, the resistance value is changed. When the direction of the additional magnetic field and the direction of the bias magnetic field are the same, the resistance value is decreased. On the other hand, when the directions are different from each other, the resistance value is increased.

In the present embodiment, the sensor section 12 has the bridge circuit. In the bridge circuit of FIG. 4, the elements representing the magnetoresistance change are Ra and Rc. Further, Rb and Rd have fixed resistance. If a voltage is applied to a pair of terminals Sa and Sc of the bridge circuit, voltages divided by the respective resistance values are outputted from a pair of terminals Sb and Sd opposite to the pair of terminals Sa and Sc. Ra and Rc constituting the bridge circuit have resistance to be changed by magnetism, and thus the voltages corresponding to that magnetism are outputted.

In the present embodiment, the voltage generating section 11 has the switches $SW_1$ and $SW_2$ and switches the polarity (direction) of the voltage to be applied to the sensor section 12 by the control signal $\phi 1$ from the control section 17. If the control signal $\phi 1$ is high (H signal), Vdd is connected to the terminal Sa by the switches $SW_1$ and $SW_2$, the voltage is applied in a direction from the terminal Sa to the terminal Sd. If the control signal $\phi 1$ is low (L signal), Vdd is connected to the terminal Sd by the switches $SW_1$ and $SW_2$, the voltage is applied in a direction from the terminal Sd to the terminal Sa.

As shown in FIG. 4, the bias magnetic field generating section 16 switches the direction of a current flowing in a coil 121 attached to the sensor section 12 by the control signal $\phi 2$ from the control section 17 and applies a bias magnetic field having an inverted polarity to the sensor section 12. If the control signal $\phi 2$ is high (H signal), a current flows by the switches $SW_3$ and $SW_4$ in a clockwise direction as viewed from above, and the bias magnetic field occurs in the sensor section 12 in an HA direction of FIG. 3. If the control signal $\phi 2$ is low (L signal), a current flows by the switches $SW_3$ and $SW_4$ in a direction opposite to the above-described direction, and the bias magnetic field occurs in the sensor section 12 in an HB direction of FIG. 3.

In the detecting section 13, the amplifier 131 is connected to the terminals Sb and Sd of the bridge circuit so as to load the output of the sensor section 12. The capacitor 133 is charged with the loaded voltage via the switch $SW_5$. Further, the loaded voltage is connected to the input terminal of the amplifier 132. Moreover, the switch $SW_5$ is controlled by the control signal $\phi 3$ of the control section 17. If the control signal $\phi 3$ is high (H signal), the output of the amplifier 131 is connected to the capacitor 133 by the switch $SW_5$. If the control signal $\phi 3$ is low (L signal), the connection to the capacitor 133 is released by the switch $SW_5$. The amplifier 132 operates to amplify the difference between the voltage value of the capacitor 133 and the voltage value, which is the output of the amplifier 131. Accordingly, the difference between the voltage values when the direction of the bias magnetic field to be applied to the sensor section 12 is switched is amplified and outputted.

Next, the operation of the electronic azimuth meter having the above-described configuration will be described. Moreover, it is assumed that the bias magnetic field in the same direction as the magnetic field of magnetism (geomagnetism) to be detected is a positive direction.

In the sensor section 12 of the electronic azimuth meter according to the present embodiment, a driving mode is divided into four stages to be described below. In each stage, the states of the control signals are shown in FIG. 5.

S1: VOLTAGE IS POSITIVE AND BIAS MAGNETIC FIELD IS POSITIVE

S2: VOLTAGE IS POSITIVE AND BIAS MAGNETIC FIELD IS NEGATIVE

S3: VOLTAGE IS NEGATIVE AND BIAS MAGNETIC FIELD IS POSITIVE

S4: VOLTAGE IS NEGATIVE AND BIAS MAGNETIC FIELD IS NEGATIVE

Figure 4A:
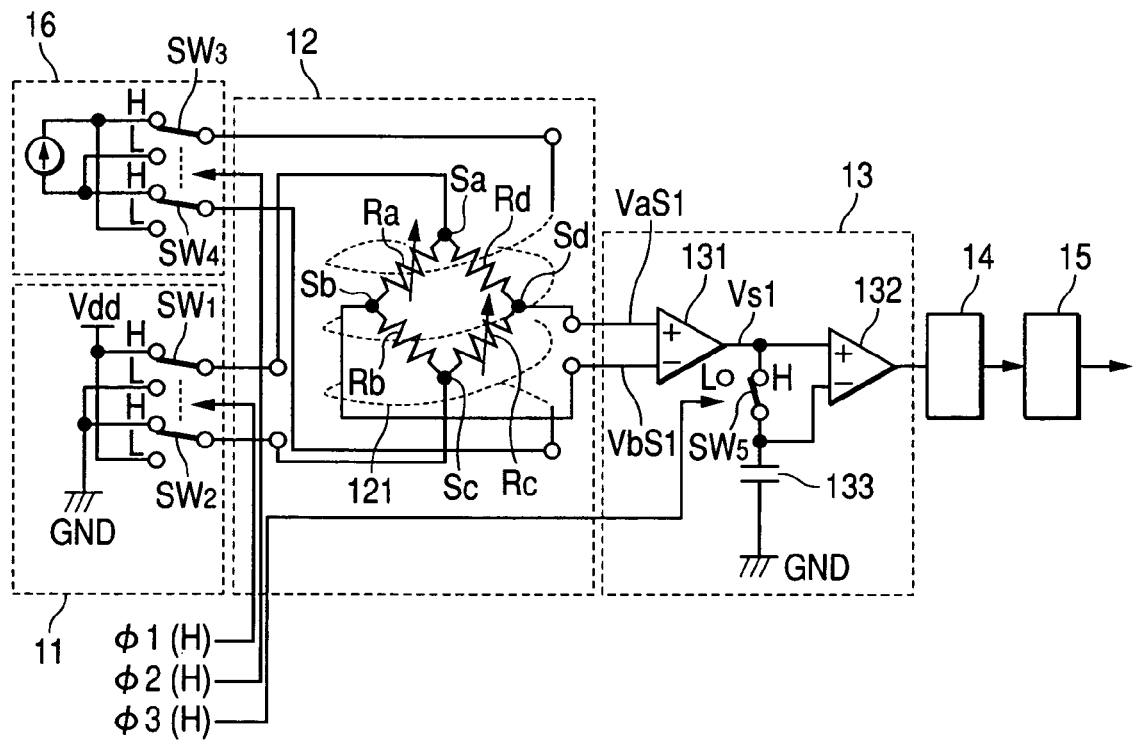
FIG. 4A is a circuit diagram showing a stage S1 in the electronic azimuth meter according to the first embodiment of the invention.
Figure 4B:
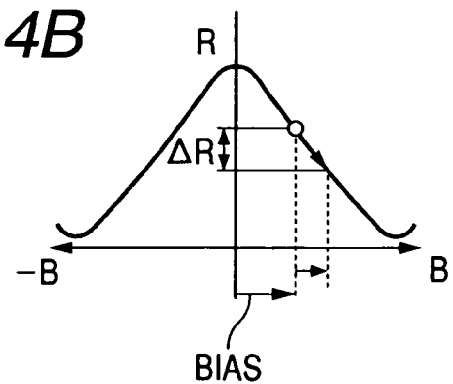
FIG. 4B is a diagram showing a resistance change of a magnetoresistive element.

In the stage S1, as shown in FIG. 4A, the voltage to be applied to the sensor section 12 is positive (the control signal φ1 is H signal), and the bias magnetic field to be applied to the sensor section 12 is positive (the control signal φ2 is H signal). For this reason, the resistance change of the magnetoresistive element is as shown in FIG. 4B. Generally, in a case in which only the bias magnetic field exists with no magnetic field from the outside, the voltages to be outputted from the sensor section 12 are Vacen and Vbcen. On the other hand, in a case in which the magnetic field from the outside exists, a voltage ΔV according to the resistance change amount ΔR is added to the above-described voltages, and voltages with the voltage ΔV added thereto are outputted from the sensor section 12. When the voltage of the terminal Sd is VaS1 and the voltage of the terminal Sb is VbS1, these voltages are represented by the following equations (1) and (2), respectively.

$$VaS1 = Vacen - \Delta V \quad \text{Equation (1)}$$

$$VbS1 = Vbcen + \Delta V \quad \text{Equation (2)}$$

At this time, the voltage value Vs1 (first voltage value) to be outputted from the amplifier 131 in the detecting section 13 is represented by the following equation (3).

$$Vs1 = VaS1 - VbS1 = (Vacen - \Delta V) - (Vbcen + \Delta V) = -2\Delta V + Vacen - Vbcen \quad \text{Equation (3)}$$

Since the control signal φ3 is H signal, the voltage value Vs1 is stored in the capacitor 133 in the detecting section 13.

Figure 6A:
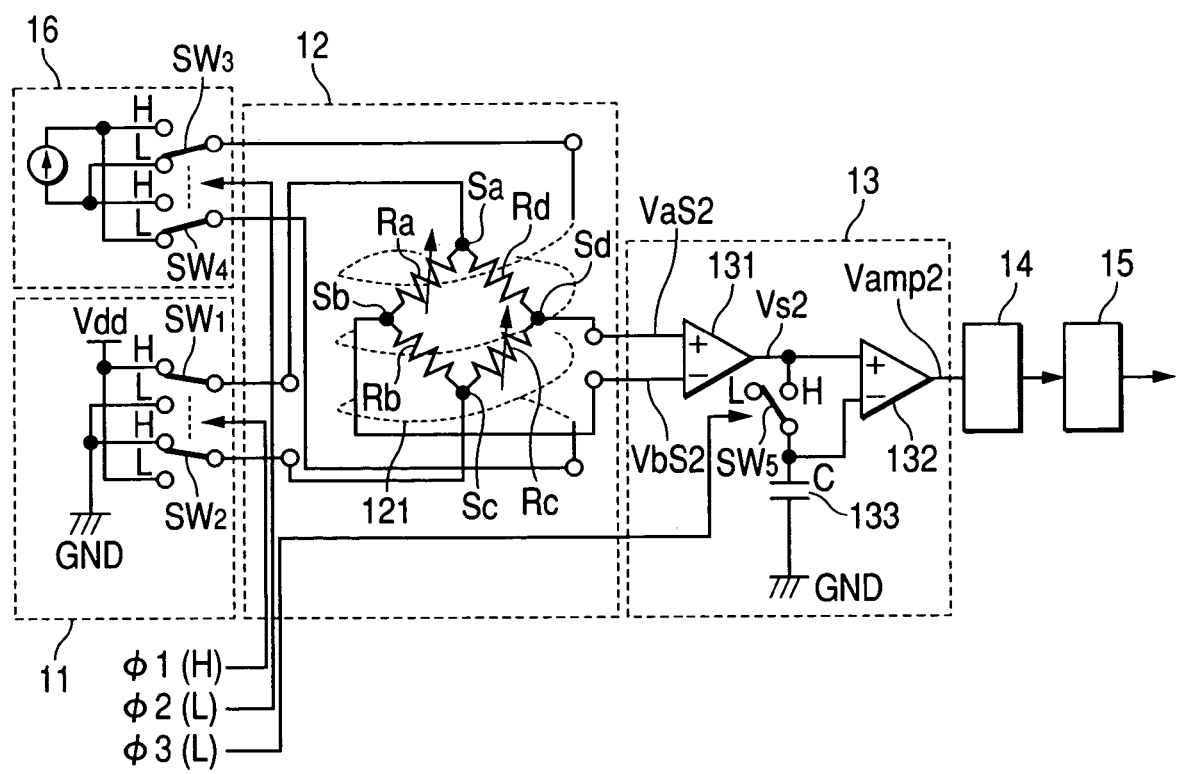
FIG. 6A is a circuit diagram showing a stage S2 in the electronic azimuth meter according to the first embodiment of the invention.
Figure 6B:
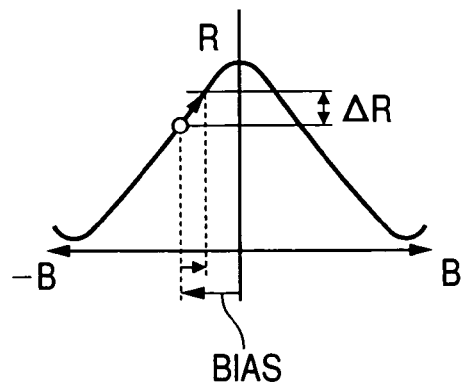
FIG. 6B is a diagram showing a resistance change of a magnetoresistive element.

In the stage S2, as shown in FIG. 6A, the voltage to be applied to the sensor section 12 is positive (the control signal φ1 is H signal), and the bias magnetic field to be applied to the sensor section 12 is negative (the control signal φ2 is L signal). For this reason, the resistance change of the magnetoresistive element is as shown in FIG. 6B. In this case, as compared with FIG. 4A, it is different in that the polarity of the bias magnetic field is inverted. In view of this point, the voltage values to be outputted from the sensor section 12 are represented by the following equations (4) and (5).

$$VaS2 = Vacen + \Delta V \quad \text{Equation (4)}$$

$$VbS2 = Vbcen - \Delta V \quad \text{Equation (5)}$$

At this time, the voltage value Vs2 (second voltage value) to be outputted from the amplifier 131 in the detecting section 13 is represented by the following equation (6).

$$Vs2 = VaS2 - VbS2 = (Vacen + \Delta V) - (Vbcen - \Delta V) = 2\Delta V + Vacen - Vbcen \quad \text{Equation (6)}$$

At this time, since the control signal φ3 is L signal, the difference between Vs2 and Vs1 at the stage S1 is taken and amplified by the amplifier 132. When an internal offset error of the amplifier 132 is Vofs and the voltage (first voltage) amplified by the amplifier 132 is Vamp2, the following equation (7) is obtained. Moreover, hereinafter, for simplicity of explanation, a case in which an amplification factor is one will be described.

$$Vamp2 = Vs1 - Vs2 - Vofs = -2\Delta V + Vacen - Vbcen - (2\Delta V + Vacen - Vbcen) - Vofs = -4\Delta V - Vofs \quad \text{Equation (7)}$$

This voltage value is subjected to a digital signal processing by the AD converting section 14 and is stored in the data storing section 151 of the operating section 15 as data $D_{D1}$. Data $D_{D1}$ is digital data but has the same level as Vamp2.

Figure 7:
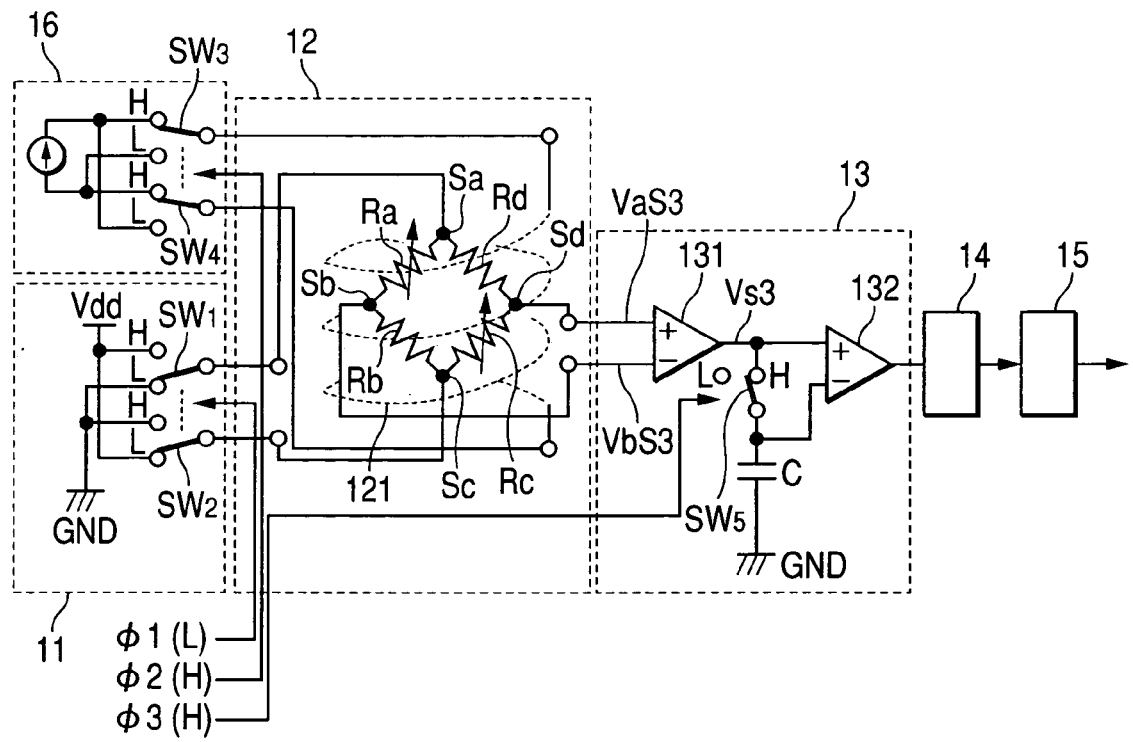
FIG. 7 is a circuit diagram showing a stage S3 in the electronic azimuth meter according to the first embodiment of the invention.

In the stage S3, as shown in FIG. 7, the voltage to be applied to the sensor section 12 is negative (the control signal φ1 is L signal), and the bias magnetic field to be applied to the sensor section 12 is positive (the control signal φ2 is H signal). For this reason, the resistance change of the magnetoresistive element is as shown in FIG. 4B. In this case, as compared with FIG. 4A, it is different in that the polarity of the voltage is inverted. In view of this point, the voltage values to be outputted from the sensor section 12 are represented by the following equations (8) and (9).

$$VaS3 = Vacen + \Delta V \quad \text{Equation (8)}$$

$$VbS3 = Vbcen - \Delta V \quad \text{Equation (9)}$$

At this time, the voltage value Vs3 (first voltage value) to be outputted from the amplifier 131 in the detecting section 13 is represented by the following equation (10).

$$Vs3 = VaS3 - VbS3 = (Vacen + \Delta V) - (Vbcen - \Delta V) = 2\Delta V + Vacen - Vbcen \quad \text{Equation (10)}$$

Since the control signal φ3 is H signal, the voltage value Vs3 is stored in the capacitor 133 in the detecting section 13.

Figure 8:
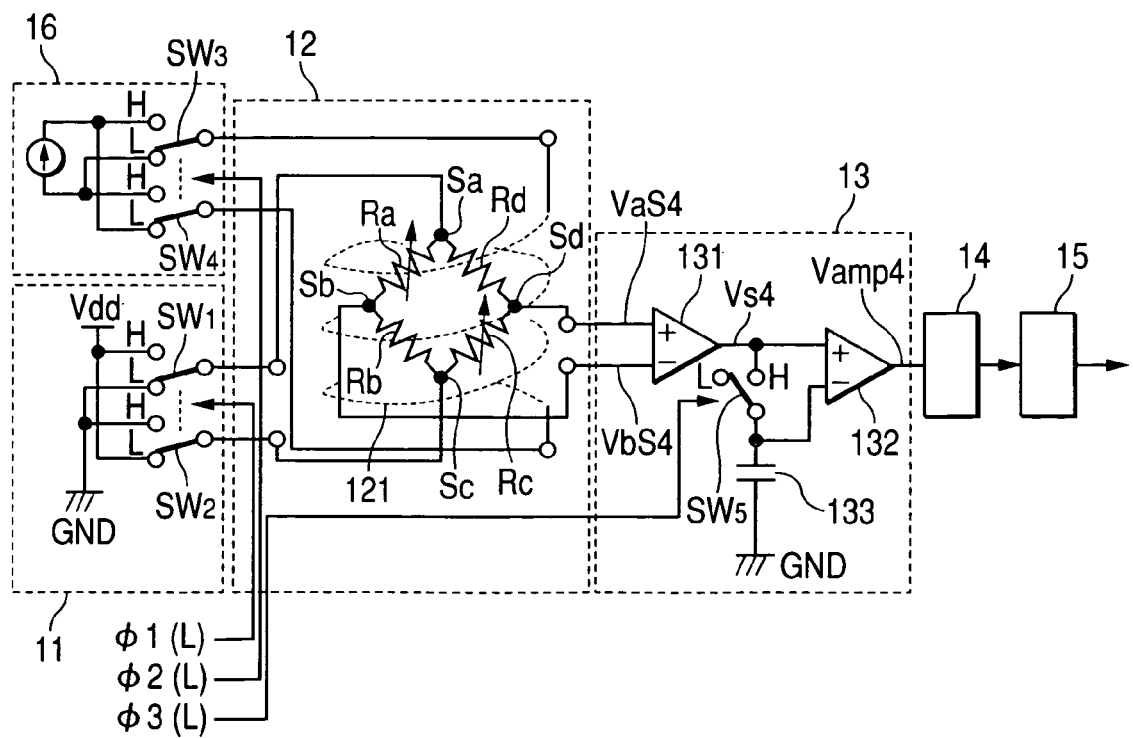
FIG. 8 is a circuit diagram showing a stage S4 in the electronic azimuth meter according to the first embodiment of the invention.

In the stage S4, as shown in FIG. 8, the voltage to be applied to the sensor section 12 is negative (the control signal φ1 is L signal), and the bias magnetic field to be applied to the sensor section 12 is negative (the control signal φ2 is L signal). For this reason, the resistance change of the magnetoresistive element is as shown in FIG. 6B. In this case, as compared with FIG. 4A, it is different in that the polarities of the voltage and the bias magnetic field are inverted. In view of this point, the voltage values to be outputted from the sensor section 12 are represented by the following equations (11) and (12).

$$VaS4 = Vacen - \Delta V \quad \text{Equation (11)}$$

$$VbS4 = Vbcen + \Delta V \quad \text{Equation (12)}$$

At this time, the voltage value Vs4 (second voltage value) to be outputted from the amplifier 131 in the detecting section 13 is represented by the following equation (13).

$$Vs4 = VaS4 - VbS4 = (Vacen - \Delta V) - (Vbcen + \Delta V) = -2\Delta V + Vacen - Vbcen \quad \text{Equation (13)}$$

At this time, since the control signal φ3 is L signal, the difference between Vs4 and Vs3 at the stage S3 is taken and amplified by the amplifier 132. When the internal offset error of the amplifier 132 is Vofs and the voltage (second voltage) amplified by the amplifier 132 is Vamp4, the following equation (14) is obtained. Here, the amplification factor is set to one.

$$Vamp4 = Vs3 - Vs4 - Vofs = 2\Delta V + Vacen - Vbcen - (-2\Delta V + Vacen - Vbcen) - Vofs = 4\Delta V - Vofs \quad \text{Equation (14)}$$

This voltage value is subjected to a digital signal processing by the AD converting section 14 and is transmitted to the differential operating section 152 of the operating section 15 as data $D_{D2}$. At this time, data $D_{D1}$ stored in the data storing section 151 is also transmitted to the differential operating section 152. Moreover, data $D_{D2}$ is digital data but has the same level as Vamp4.

Next, the differential operation of $D_{D1}$ and $D_{D2}$ is performed by the differential operating section 152, and the operation result is stored in the data storing sections 154 to 156 via the selecting section 153. When the result of the differential operation (differential voltage) is $D_{out}$, the following equation (15) is obtained, and Vofs is eliminated.

$$D_{Dout} = D_{D1} - D_{D2} = (-4\Delta V - Vofs) - (4\Delta V - Vofs) = -8\Delta V \quad \text{Equation (15).}$$

Since the sensor section 12 has three axes of the X axis, the Y axis, and the Z axis, the differential voltage $D_{Dout}X$ for the X axis, the differential voltage $D_{Dout}Y$ for the Y axis, and the differential voltage $D_{Dout}Z$ for the Z axis are calculated by the above-described processing, respectively. These differential voltages are stored in the data storing sections 154 to 156, respectively. Then, in the azimuth calculating section 157, the azimuth is calculated by use of the differential voltages stored in the data storing sections 154 to 156. That is, the azimuth is calculated by taking an arc tangent with respect to the ratio between the differential voltage $D_{Dout}X$ for the X axis and the differential voltage $D_{Dout}Y$ for the Y axis. Further, the differential voltage $D_{Dout}Z$ for the Z axis is used in an operation to correct an inclined state of the electronic azimuth meter. For example, when the electronic azimuth meter according to the invention is mounted on a cellular phone or the like, it can be expected that the cellular phone is used in an inclined state. In this case, the correction operation is performed by use of the differential voltage $D_{Dout}Z$ for the Z axis in order to calculate the azimuth.

As such, by using the differential voltage $D_{Dout}$ calculated from the magnetoresistance change, the azimuth calculation can be performed. As for the magnetism detection, by taking the difference of the first and second output voltages calculated by inverting the polarities of the bias magnetic field and the voltage, as shown in the above-described equation (15), the offset voltage Vofs occurring in the circuit (in particular, the amplifier 132 in the detecting section 13) can be eliminated. Therefore, the azimuth calculation can be performed with higher precision.

Second Embodiment

In the present embodiment, the configuration of the detecting section in which a subtraction of a second voltage value obtained by use of a bias magnetic field of the other polarity from a first voltage value obtained by use of a bias magnetic field of one polarity, and a subtraction of the first voltage value obtained by use of the bias magnetic field of one polarity from the second voltage value obtained by use of the bias magnetic field of the other polarity are switched. In this configuration, the voltage generating section 11 of the electronic azimuth meter shown in FIG. 1 is omitted so as not to invert the polarity of the voltage.

Further, according to this configuration, in the detecting section 13, there is provided a switching unit for switching the subtraction of the second voltage value obtained by use of the bias magnetic field of the other polarity from the first voltage value obtained by use of the bias magnetic field of one polarity, and the subtraction of the first voltage value obtained by use of the bias magnetic field of one polarity from the second voltage value obtained by use of the bias magnetic field of the other polarity (subtraction direction). In this case, the first voltage to be applied to the sensor section 12 at the time of calculating the first output voltage is equal to the second voltage to be applied to the sensor section 12 at the time of calculating the second output voltage.

Moreover, the AD converting section and the operating section 15 are the same as those of the first embodiment and the descriptions thereof will be omitted. In the sensor section 12, a voltage is applied between the terminals Sa and Sc of the bridge circuit.

Figure 9:
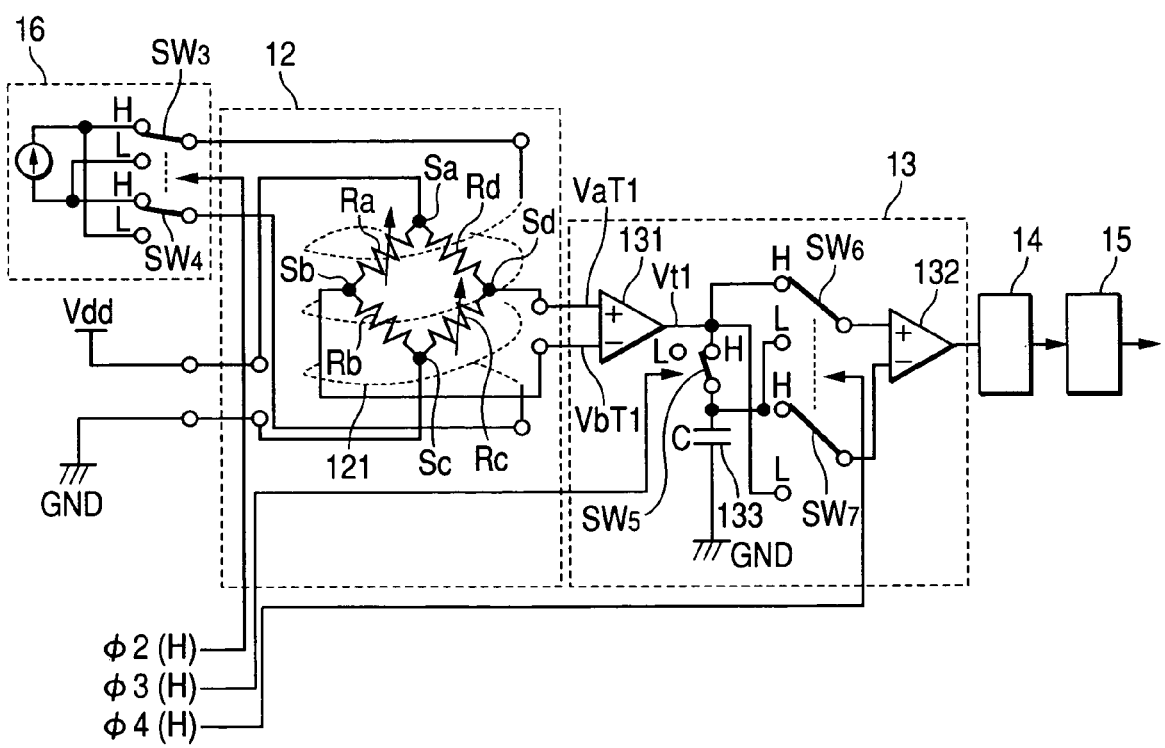
FIG. 9 is a circuit diagram showing a stage T1 in an electronic azimuth meter according to a second embodiment of the invention.

FIG. 9 is a circuit diagram showing an electronic azimuth meter according to the second embodiment of the invention. In the detecting section 13, the amplifier 131 is connected to the terminals Sb and Sd of the bridge circuit so as to load the output of the sensor section 12. The capacitor 133 is charged with the loaded voltage via the switch $SW_5$. Further, the loaded voltage is connected to the input terminal of the amplifier 132. Moreover, the switch $SW_5$ is controlled by the control signal φ3 of the control section 17. If the control signal φ3 is high (H signal), the output of the amplifier 131 is connected to the capacitor 133 by the switch $SW_5$. If the control signal φ3 is low (L signal), the connection to the capacitor 133 is released by the switch $SW_5$. The amplifier 132 operates to amplify the difference between the voltage value of the capacitor 133 and the voltage value, which is the output of the amplifier 131. Accordingly, the difference between the voltage values when the direction of the bias magnetic field to be applied to the sensor section 12 is switched is amplified and outputted.

In front of the amplifier 132, there are provided switches $SW_6$ and $SW_7$ for switching the subtraction of the second voltage value obtained by use of the bias magnetic field of the other polarity from the first voltage value obtained by use of the bias magnetic field of one polarity, and the subtraction of the first voltage value obtained by use of the bias magnetic field of one polarity from the second voltage value obtained by use of the bias magnetic field of the other polarity (subtraction direction). The connection mode (straight or cross) of the amplifier 131 and the capacitor 133, and the amplifier 132 is switched by the switches $SW_6$ and $SW_7$. When the connection is straight, the second voltage value obtained by use of the bias magnetic field of the other polarity (here, negative) is subtracted from the first voltage value obtained by use of the bias magnetic field of one polarity (here, positive). When the connection is cross, the first voltage value obtained by use of the bias magnetic field of one polarity (here, positive) is subtracted from the second voltage value obtained by use of the bias magnetic field of the other polarity (here, negative).

Moreover, the switches $SW_6$ and $SW_7$ are controlled by the control signal φ4 of the control section 17. If the control signal φ4 is high (H level), the output of the amplifier 131 is a positive (+) terminal of the amplifier 132 by the switches $SW_6$ and $SW_7$. If the control signal φ4 is low (L level), the output of the amplifier 131 is a negative (−) terminal of the amplifier 132 by the switches $SW_6$ and $SW_7$ and the capacitor 133 is connected to the positive (+) terminal of the amplifier 132. The amplifier 132 operates to amplify the difference between the voltage value of the capacitor 133 and the voltage value, which is the output of the amplifier 131. Accordingly, the difference between the voltage values when the direction of the bias magnetic field to be applied to the sensor section 12 is switched is amplified and outputted.

Next, the operation of the electronic azimuth meter having the above-described configuration will be described. Moreover, it is assumed that the bias magnetic field in the same direction as the magnetic field of magnetism (geomagnetism) to be detected is a positive direction. Further, the amplification factor is set to one.

In the sensor section 12 of the electronic azimuth meter according to the present embodiment, a driving mode is divided into four stages to be described below. In each stage, the states of the control signals are shown in FIG. 10.

T1: SWITCHES $SW_6$ AND $SW_7$ ARE HIGH (STRAIGHT CONNECTION) AND BIAS MAGNETIC FIELD IS POSITIVE

T2: SWITCHES $SW_6$ AND $SW_7$ ARE HIGH (STRAIGHT CONNECTION) AND BIAS MAGNETIC FIELD IS NEGATIVE

T3: SWITCHES $SW_6$ AND $SW_7$ ARE LOW (CROSS CONNECTION) AND BIAS MAGNETIC FIELD IS POSITIVE

T4: SWITCHES $SW_6$ AND $SW_7$ ARE LOW (CROSS CONNECTION) AND BIAS MAGNETIC FIELD IS NEGATIVE

In the stage T1, as shown in FIG. 9, the bias magnetic field to be applied to the sensor section 12 is positive (the control signal φ2 is H signal), and the output of the amplifier 131 and the output of the capacitor 133 in the detecting section 13 is straight-connected (the control signal φ4 is H signal). For this reason, the resistance change of the magnetoresistive element is as shown in FIG. 4B. Generally, in a case in which only the bias magnetic field exists with no magnetic field from the outside, the voltages to be outputted from the sensor section 12 are Vacen and Vbcen. On the other hand, in a case in which the magnetic field from the outside exists, the voltage ΔV according to the resistance change amount ΔR is added to the above-described voltages, and voltages with the voltage ΔV added thereto are outputted from the sensor section 12. When the voltage of the terminal Sd is VaT1 and the voltage of the terminal Sb is VbT1, these voltages are represented by the following equations (16) and (17), respectively.

VaT1=Vacen−ΔV  Equation (16)

VbT1=Vbcen+ΔV  Equation (17)

At this time, the voltage value Vt1 (first voltage value) to be outputted from the amplifier 131 in the detecting section 13 is represented by the following equation (18).

Vt1=VaT1−VbT1=(Vacen−ΔV)−(Vbcen−ΔV)=−2 ΔV+Vacen−Vbcen  Equation (18)

Since the control signal φ3 is H signal, the voltage value Vt1 is stored in the capacitor 133 in the detecting section 13.

Figure 11:
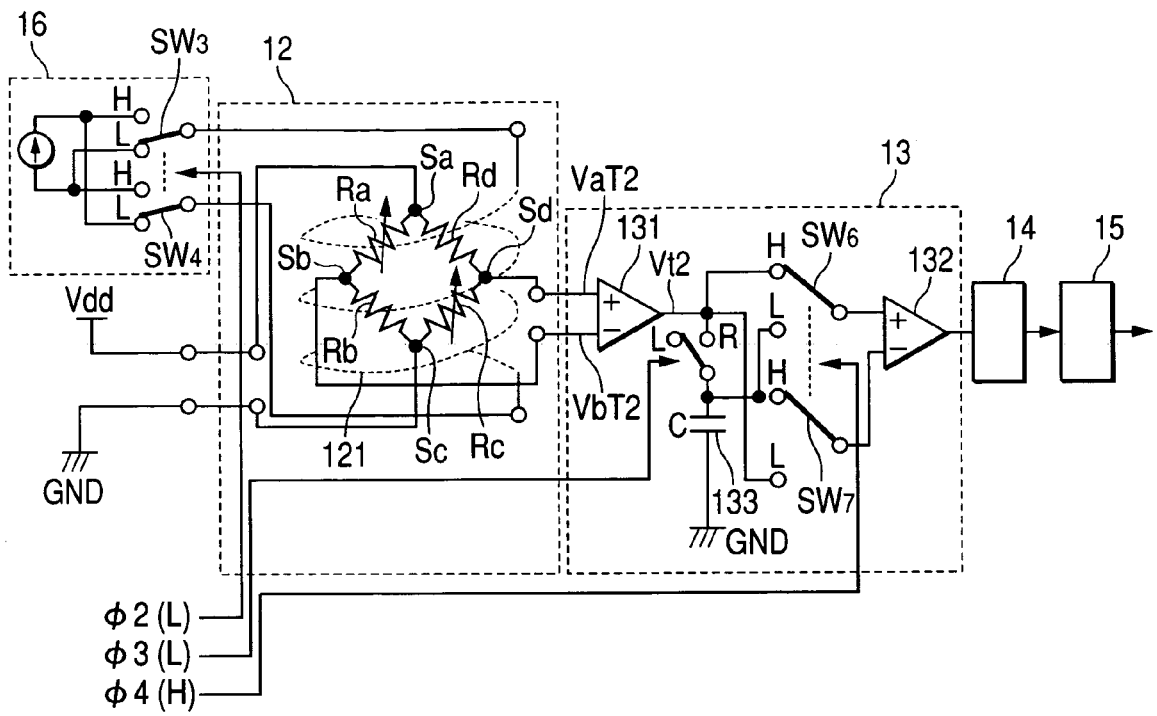
FIG. 11 is a circuit diagram showing a stage T2 in the electronic azimuth meter according to the second embodiment of the invention.

In the stage T2, as shown in FIG. 11, the bias magnetic field to be applied to the sensor section 12 is negative (the control signal φ2 is L signal), and the output of the amplifier 131 and the output of the capacitor 133 in the detecting section 13 is straight-connected (the control signal φ4 is H signal). For this reason, the resistance change of the magnetoresistive element is as shown in FIG. 6B. In this case, as compared with FIG. 9, it is different in that the polarity of the bias magnetic field is inverted. In view of this point, the voltage values to be outputted from the sensor section 12 are represented by the following equations (19) and (20).

VaT2=Vacen+ΔV  Equation (19)

VbT2=Vbcen−ΔV  Equation (20)

At this time, the voltage value Vt2 (second voltage value) to be outputted from the amplifier 131 in the detecting section 13 is represented by the following equation (21).

Vt2=VaT2−VbT2=(Vacen+ΔV)−(Vbcen−ΔV)=2 ΔV+Vacen−Vbcen  Equation (21)

At this time, since the control signal φ3 is L signal, the difference between Vt2 and Vt1 at the stage T1 is taken and amplified by the amplifier 132. At this time, since the control signal φ4 is H signal, as regards the amplifier 132, the straight connection is made. That is, the second voltage value (Vt2) obtained by use of the negative bias magnetic field is subtracted from the first voltage value (Vt1) obtained by use of the positive bias magnetic field. When the internal offset error of the amplifier 132 is Vofs and the voltage (first voltage) amplified by the amplifier 132 is Vamp2, the following equation (22) is obtained.

Vamp2=Vt1−Vt2−Vofs=−2 ΔV+Vacen−Vbcen−(2 ΔV+Vacen−Vbcen)−Vofs=−4 ΔV−Vofs  Equation (22)

This voltage value is subjected to a digital signal processing by the AD converting section 14 and is stored in the data storing section 151 of the operating section 15 as data $D_{D1}$. Data $D_{D1}$ is digital data but has the same level as Vamp2.

Figure 12:
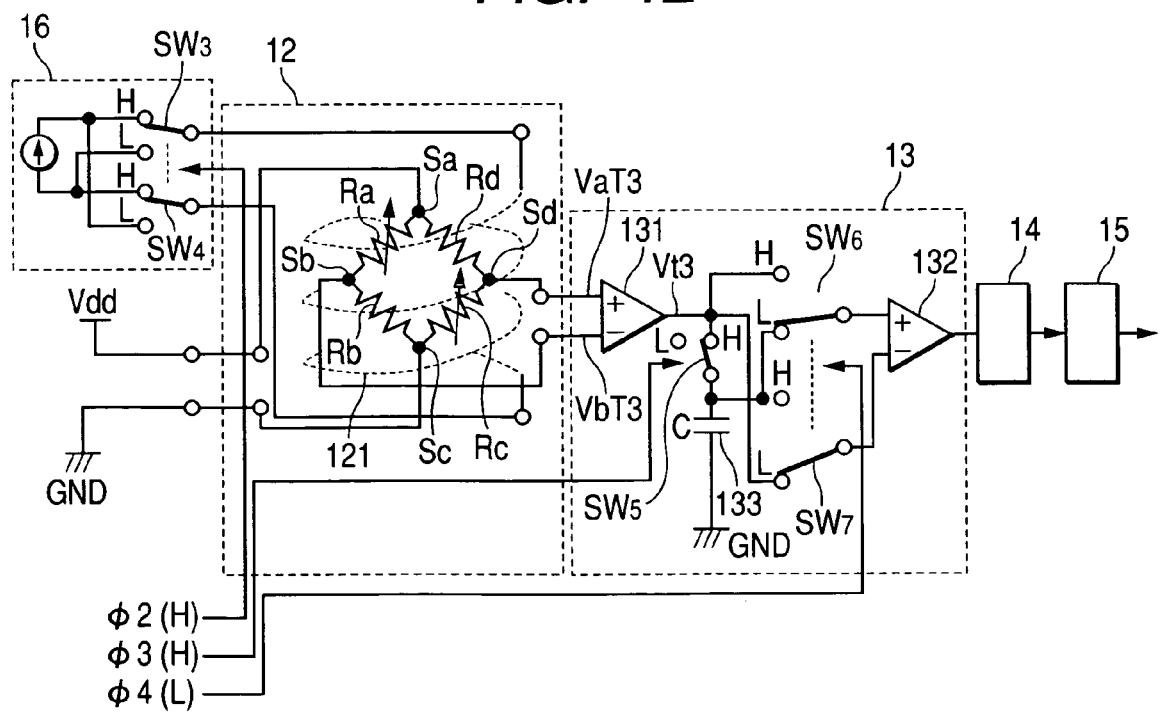
FIG. 12 is a circuit diagram showing a stage T3 in the electronic azimuth meter according to the second embodiment of the invention.
Figure 13:
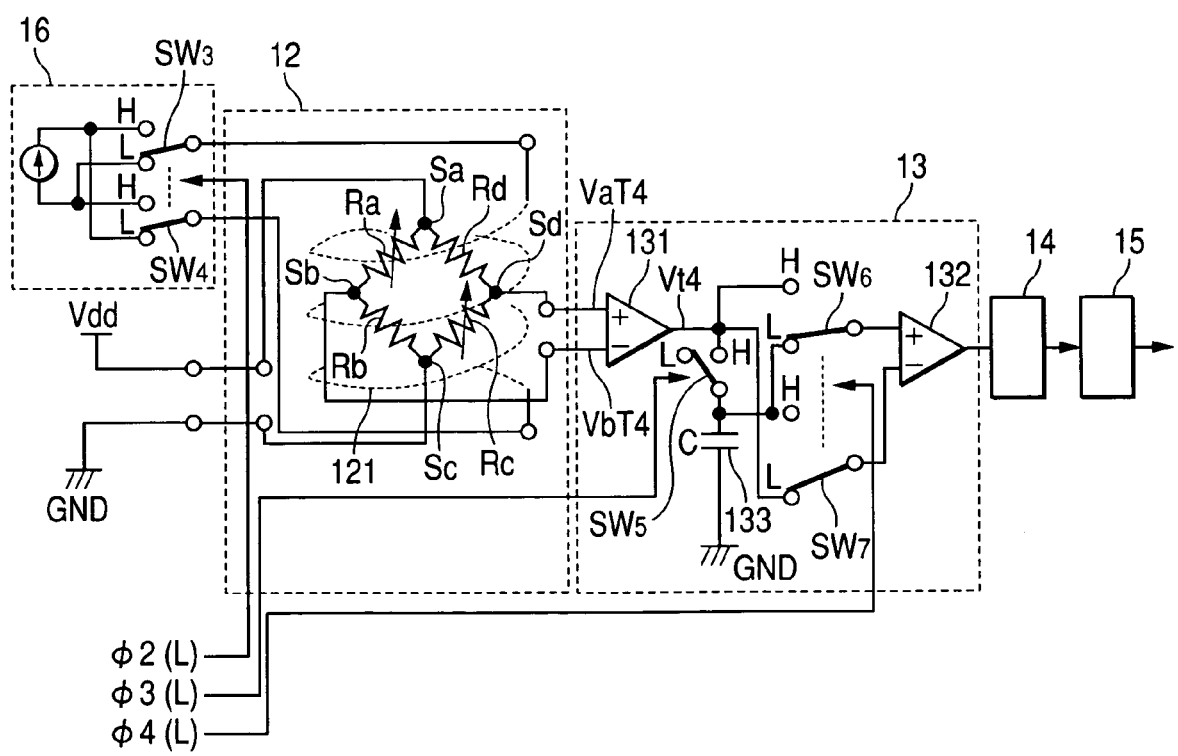
FIG. 13 is a circuit diagram showing a stage T4 in the electronic azimuth meter according to the second embodiment of the invention.

In the stage T3, as shown in FIG. 12, the bias magnetic field to be applied to the sensor section 12 is positive (the control signal φ2 is H signal), and the output of the amplifier 131 and the output of the capacitor 133 in the detecting section 13 is cross-connected (the control signal φ4 is L signal). For this reason, the resistance change of the magnetoresistive element is as shown in FIG. 4B. In this case, the voltage values to be outputted from the sensor section 12 are represented by the following equations (23) and (24).

VaT3=Vacen−ΔV  Equation (23)

VbT3=Vbcen+ΔV  Equation (24)

At this time, the voltage value Vt3 (first voltage value) to be outputted from the amplifier 131 in the detecting section 13 is represented by the following equation (25).

Vt3=VaT3−VbT3=(Vacen−ΔV)−(Vbcen+ΔV)=−2 ΔV+Vacen−Vbcen  Equation (25)

Since the control signal φ3 is H signal, the voltage value Vt3 is stored in the capacitor 133 in the detecting section 13.

In the stage T4, as shown in FIG. 12, the bias magnetic field to be applied to the sensor section 12 is negative (the control signal φ2 is L signal), and the output of the amplifier 131 and the output of the capacitor 133 in the detecting section 13 is cross-connected (the control signal φ4 is L signal). For this reason, the resistance change of the magnetoresistive element is as shown in FIG. 6B. In this case, the voltage values to be outputted from the sensor section 12 are represented by the following equations (26) and (27).

VaT4=Vacen+ΔV  Equation (26)

VbT4=Vbcen−ΔV  Equation (27)

At this time, the voltage value Vt4 (second voltage value) to be outputted from the amplifier 131 in the detecting section 13 is represented by the following equation (28).

Vt4=VaT4−VbT4=(Vacen+ΔV)−(Vbcen−ΔV)=2 ΔV+Vacen−Vbcen  Equation (28)

At this time, since the control signal φ3 is L signal, the difference between Vt4 and Vt3 at the stage T3 is taken and amplified by the amplifier 132. At this time, since the control signal φ4 is L signal, as regards the amplifier 132, the cross connection is made. That is, the first voltage value (Vt3) obtained by use of the positive bias magnetic field is subtracted from the second voltage value (Vt4) obtained by use of the negative bias magnetic field. When the internal offset error of the amplifier 132 is Vofs and the voltage (second voltage) amplified by the amplifier 132 is Vamp4, the following equation (29) is obtained.

Vamp4=Vt4−Vt3−Vofs=2 ΔV+Vacen−Vbcen−(−2 ΔV+Vacen−Vbcen)−Vofs=4 ΔV−Vofs  Equation (29)

This voltage value is subjected to a digital signal processing by the AD converting section 14 and is transmitted to the differential operating section 152 of the operating section 15 as data $D_{D2}$. At this time, data $D_{D1}$ stored in the data storing section 151 is also transmitted to the differential operating section 152. Moreover, data $D_{D2}$ is digital data but has the same level as Vamp4.

Next, the differential operation of $D_{D1}$ and $D_{D2}$ is performed by the differential operating section 152, and the operation result is stored in the data storing sections 154 to 156 via the selecting section 153. When the result of the differential operation (differential voltage) is $D_{Dout}$, the following equation (30) is obtained, and Vofs is eliminated.

$D_{Dout}=D_{D1}−D_{D2}=(−4 ΔV−Vofs)−(4 ΔV−Vofs)=−8 ΔV$  Equation (30).

Since the sensor section 12 has three axes of the X axis, the Y axis, and the Z axis, the differential voltage $D_{Dout}X$ for the X axis, the differential voltage $D_{Dout}Y$ for the Y axis, and the differential voltage $D_{Dout}Z$ for the Z axis are calculated by the above-described processing, respectively. These differential voltages are stored in the data storing sections 154 to 156, respectively. Then, in the azimuth calculating section 157, the azimuth is calculated by use of the differential voltages stored in the data storing sections 154 to 156. That is, the azimuth is calculated by taking an arc tangent with respect to the ratio between the differential voltage $D_{Dout}X$ for the X axis and the differential voltage $D_{Dout}Y$ for the Y axis. Further, the differential voltage $D_{Dout}Z$ for the Z axis is used in an operation to correct the inclined state of the electronic azimuth meter. For example, when the electronic azimuth meter according to the invention is mounted on a cellular phone or the like, it can be expected that the cellular phone is used in an inclined state. In this case, the correction operation is performed by use of the differential voltage $D_{Dout}Z$ for the Z axis in order to calculate the azimuth.

As such, by using the differential voltage $D_{Dout}$ calculated from the magnetoresistance change, the azimuth calculation can be performed. As for the magnetism detection, the difference of the first and second output voltages calculated by inverting the polarity of the bias magnetic field and by switching the connection mode is taken, as shown in the above-described equation (30), and thus the offset voltage Vofs occurring in the circuit (in particular, the amplifier 132 in the detecting section 13) can be eliminated. Therefore, the azimuth calculation can be performed with higher precision.

The invention is not limited to the first and second embodiments, but various modifications and changes can be made. For example, though the case in which the magnetism detection for the X axis, the Y axis, and the Z axis are performed by the same circuit is described in the first and second embodiments, the magnetism detecting circuits for the X axis, the Y axis, and the Z axis may be used individually. Alternatively, the magnetism detection for the X axis and the Y axis may be performed by the same circuit and the magnetism detection for the Z axis may be performed by an additional circuit. The configurations described in the first and the second embodiments are not limited thereto, but various modifications and changes can be made without departing from the scope of the invention.

Further, though the case in which only the offset voltage of the amplifier 132 is eliminated is described in the first and second embodiments, according to the invention, offset voltages of other amplifiers or an offset voltage caused by a resistance balance of a sensor can be eliminated.

Further, in the first and second embodiments, the case in which the magnetic field is biased in the same direction as a bias from the outside is described. In the invention, however, even when a magnetic field is biased in a direction different from a bias from the outside, the offset voltage can be eliminated and the azimuth can be calculated in the same manner.

According to the invention, the difference between the first output voltage calculated by applying the bias magnetic field having an inverted polarity with respect to the first voltage and the second output voltage calculated by applying the bias magnetic field having an inverted polarity with respect to the second voltage is taken. Therefore, the offset voltage inevitably occurring in a voltage outputted from an amplifier in the magnetism detecting device can be eliminated. As a result, the azimuth can be calculated with no azimuth error.

The invention claimed is:

1. A magnetism detecting device comprising:
a magnetometric sensor that detects magnetism and outputs an output voltage based on the detected magnetism;
a bias magnetic field generating unit that applies positive and negative bias magnetic fields to the magnetometric sensor;
a voltage applying unit that applies a positive voltage and a negative voltage to the magnetometric sensor;
a detecting unit that detects voltage values obtained based on the output voltage; and
an operating unit that calculates an azimuth using the voltage values,
wherein the detecting unit calculates a first output corresponding to a difference between two voltage values each corresponding to the positive and negative bias magnetic fields, and the positive voltage,
wherein the detecting unit calculates a second output corresponding to a difference between two voltage values each corresponding to the positive and negative bias magnetic fields, and the negative voltage, and
wherein the detecting unit eliminates an offset voltage included in the first output and the second output by taking difference between the first output and the second output.

2. A magnetism detecting device comprising:
a magnetometric sensor that detects magnetism and outputs an output voltage based on the detected magnetism;
a bias magnetic field generating unit that applies positive and negative bias magnetic fields to the magnetometric sensor;
a voltage applying unit that applies a voltage to the magnetometric sensor;
a detecting unit that detects voltage values obtained based on the output voltage; and
an operating unit that calculates an azimuth using the voltage values,
wherein the detecting unit has a switching unit that receives first and second voltage values each corresponding to the positive and negative bias magnetic fields, and switches between a subtraction of the second voltage value from the first voltage value and a subtraction of the first voltage value from the second voltage value, and eliminates an offset voltage by taking difference between values before and after switching.

3. The magnetism detecting device according to claim 1 or 2,
wherein the magnetometric sensor has a magnetoresistive element that represents a symmetrical resistance change with respect to a magnetic field.

4. The magnetism detecting device according to claim 3,
wherein the magnetoresistive element is a GIG element or an MR element.

5. The magnetism detecting device according to claim 1 or 2,
wherein the magnetometric sensor has a bridge circuit.

6. An electronic azimuth meter comprising:
a plurality of magnetism detecting devices according to claim 1 or 2; and
an azimuth calculating unit that calculates the azimuth by use of difference voltages obtained by the plurality of magnetism detecting devices.

* * * * *